United States Patent
Budumuru (10) Patent No.: US 7,644,382 B2
(45) Date of Patent: Jan. 5, 2010

(54) COMMAND-LANGUAGE-BASED FUNCTIONAL ENGINEERING CHANGE ORDER (ECO) IMPLEMENTATION

(75) Inventor: Vijay Kumar Budumuru, Visakhapatnam (IN)

(73) Assignee: Agere Systems Inc., Allentown, PA (US)

( * ) Notice: Subject to any disclaimer, the term of this patent is extended or adjusted under 35 U.S.C. 154(b) by 294 days.

(21) Appl. No.: 11/749,904

(22) Filed: May 17, 2007

(65) Prior Publication Data

US 2007/0271537 A1 Nov. 22, 2007

Related U.S. Application Data

(60) Provisional application No. 60/801,364, filed on May 18, 2006.

(51) Int. Cl.
*G06F 17/50* (2006.01)
*G06F 9/45* (2006.01)

(52) U.S. Cl. .......................................... 716/5; 716/18

(58) Field of Classification Search .................. 716/5, 716/18
See application file for complete search history.

(56) References Cited

U.S. PATENT DOCUMENTS

| | | | |
|---|---|---|---|
| 5,959,905 A | 9/1999 | Payne | |
| 6,353,915 B1 * | 3/2002 | Deal et al. | 716/4 |
| 6,822,477 B1 | 11/2004 | Bingert et al. | |
| 7,373,618 B1 * | 5/2008 | Khoo et al. | 716/3 |
| 2002/0129325 A1 * | 9/2002 | Tanaka | 716/11 |
| 2003/0145297 A1 * | 7/2003 | Cote et al. | 716/6 |
| 2004/0098683 A1 * | 5/2004 | Maruyama et al. | 716/5 |
| 2006/0136855 A1 * | 6/2006 | Hoff et al. | 716/11 |

OTHER PUBLICATIONS

"ECO Flow Using Physical Compiler," by Niv Margalit, www.cs.huji.ac.il, [Retrieved on Sep. 17, 2006], Retrieved from the Internet: <URL: http://www.cs.huji.ac.il/~jarom/vlsi_seminar/2005/papers/ECO%20flow%20using%20Physical% 20Compiler.pdf> Feb. 10, 2004 (5 pages).

"Synopsys Introduces First-Ever Synthesis Tool for ECOs," www.synopsys.com, [Retrieved on Sep. 16, 2006], Retrieved from the Internet: <URL: http://www.synopsys.com/news/pubs/rsvp/spr97/rsvp_spr97_10.html> Jun. 30, 1997 (2 pages).

"The Human ECO Compiler," by Steve Golson, www.trilobyte.com, [Retrieved on Sep. 18, 2006], Retrieved from the Internet: <URL: http:/www.trilobyte.com/pdf/golson_snug04.pdf> Mar. 12, 2004 (57 pages).

* cited by examiner

*Primary Examiner*—Jack Chiang
*Assistant Examiner*—Magid Y Dimyan
(74) *Attorney, Agent, or Firm*—Mendelsohn, Drucker & Associates, P.C.; Edward J. Meisarosh; Steve Mendelsohn (57) ABSTRACT

In one implementation, the invention can be a computer-implemented method for generating an engineering change order (ECO) netlist for an integrated circuit (IC). The method includes performing a formal equivalence check between an implementation netlist and a reference netlist to identify one or more corresponding failed compare points in the implementation and reference netlists. The method further includes, for at least one failed comparison: (i) performing equivalence verifications based on fan-in cones for the failed compare points, to generate pin pass/fail information, (ii) tracing the fan-in cone for the reference netlist to generate ECO pin and cell information, and (iii) modifying the implementation netlist, based on (1) the pin pass/fail information, (2) cell connectivity information, (3) cell description information, and (4) the ECO pin and cell information, to generate the ECO netlist by adding one or more new ECO cells to the implementation netlist and appropriately connecting them.

20 Claims, 4 Drawing Sheets

COMMAND-LANGUAGE-BASED FUNCTIONAL ENGINEERING CHANGE ORDER (ECO) IMPLEMENTATION

REFERENCE TO PROVISIONAL APPLICATION

This application claims the benefit of the filing date of U.S. provisional application No. 60/801,364 filed on May 18, 2006, the teachings of which are incorporated herein by reference.

BACKGROUND OF THE INVENTION

1. Field of the Invention

The present invention relates to design of integrated circuits (ICs), and in particular, to implementation of engineering change orders (ECOs) in the IC design process.

2. Description of the Related Art

The design of an integrated circuit (IC) is a complex, lengthy, multi-step process performed with the aid of computers. Electronic design automation (EDA) tools are software tools used in the design of ICs. EDA tools are used to create, test, and edit the high-level design of an IC and then transform the resultant high-level design into a netlist layout for the physical components and their connections. The physical components and their connections will then be etched into a semiconductor substrate to make a physical IC device.

A typical design flow includes the generation of a register transfer level (RTL) design, which defines the IC's functions, such as signal flows or data transfers, at a high level. The RTL design is described using a hardware description language (HDL). A logic synthesis tool, such as the Design Compiler tool from Synopsis, Inc., of Mountain View, Calif., transforms an RTL design for an IC described with an HDL into a netlist for that IC. The netlist describes the logic gates of the IC and their interconnections. A place-and-route tool is then used to arrange the placement of the gates and their interconnections within the IC floorplan. The place-and-route tool generates a placed and routed netlist, which is used to generate masks that define the physical components and their connections. The masks are then used to etch semiconductor wafers to generate physical instances of the IC.

As ICs can be quite complex, and some interactions among components may not be foreseen at early design stages, or requirements may change, it sometimes becomes necessary to modify the RTL design after a placed and routed netlist has already been generated. One way to implement the changes is to modify the RTL according to the new requirements and go through the entire design flow to get a new placed and routed netlist. The placed and routed netlist is then processed to generate a placed and routed database, which includes netlist information, as well as physical dimension information about the cells in the netlist and their interconnections. However, going through the entire design workflow anew can be time-consuming and costly. Furthermore, the normal process flow can be unpredictable and chaotic, wherein small changes to the input may cause large differences in the output. A more efficient system and method for implementing netlist changes would be desirable.

SUMMARY OF THE INVENTION

One implementation of the invention can be a computer-implemented method for generating an engineering change order (ECO) netlist for an integrated circuit (IC). The method includes performing a formal equivalence check between an implementation netlist and a reference netlist to identify one or more corresponding failed compare points in the implementation and reference netlists. The method further includes, for at least one failed comparison: (i) performing equivalence verifications based on fan-in cones for the failed compare points, to generate pin pass/fail information, (ii) tracing the fan-in cone for the reference netlist to generate ECO pin and cell information, and (iii) modifying the implementation netlist, based on (1) the pin pass/fail information, (2) cell connectivity information, (3) cell description information, and (4) the ECO pin and cell information, to generate the ECO netlist by adding one or more new ECO cells to the implementation netlist and appropriately connecting them.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Another way to implement changes to the RTL design is to use an ECO (engineering change order) tool. An ECO tool uses the old RTL design, the new RTL design, and the old placed and routed netlist to generate an ECO netlist which is then processed to generate a new placed and routed database. The new placed and routed netlist defined by the new placed and routed database should be functionally equivalent to the new RTL design.

The generation of an ECO placed and routed netlist is accomplished in several steps. The old RTL design, new RTL design, and old placed and routed netlist are processed in an ECO-synthesis step to produce an ECO netlist. Then an incremental place-and-route tool is used with the old placed and routed netlist and the ECO netlist to remove the modified cells and connection nets and then place and route the new cells to produce an ECO placed and routed netlist.

The ECO-synthesis step referred to above, in which the ECO netlist is generated manually, includes the following steps:

(i) Formally verify, i.e., using a formal verification EDA tool such as the Formality tool from Synopsis, Inc., the equivalence of the old RTL design and the old netlist;

(ii) Identify the differences between the old RTL design and the new RTL design;

(iii) Formally verify the differences between the old netlist and the new RTL design;

(iv) Manually explore the old netlist with appropriate EDA tools to locate cells to be edited by appropriate ECO tools;

(v) Design one or more logic fixes to implement the ECO in the old netlist;

(vi) Modify the old netlist to generate the ECO netlist; and (vii) Formally verify the equivalence of the new RTL and the ECO netlist.

One embodiment of the present invention is a method for an iterative implementation of an ECO, given old and new RTL designs and an old netlist. The old netlist is referred to as the implementation netlist since the ECO will be implemented by making modifications to it. If attempting to implement a manual ECO becomes, or appears likely to become, too tedious, difficult, or time-consuming, then a novel iterative ECO implementation process, which is preferably automated, may be used. The iterative implementation may be automated and executed by a computer, thereby eliminating the need to manually explore netlists to determine how to implement the ECO and thereby likely significantly reducing the time required to implement the ECO. The automation of the iterative ECO implementation can be accomplished with a script written in a command-based EDA language, such as tool command language (TCL).

Figure 1:
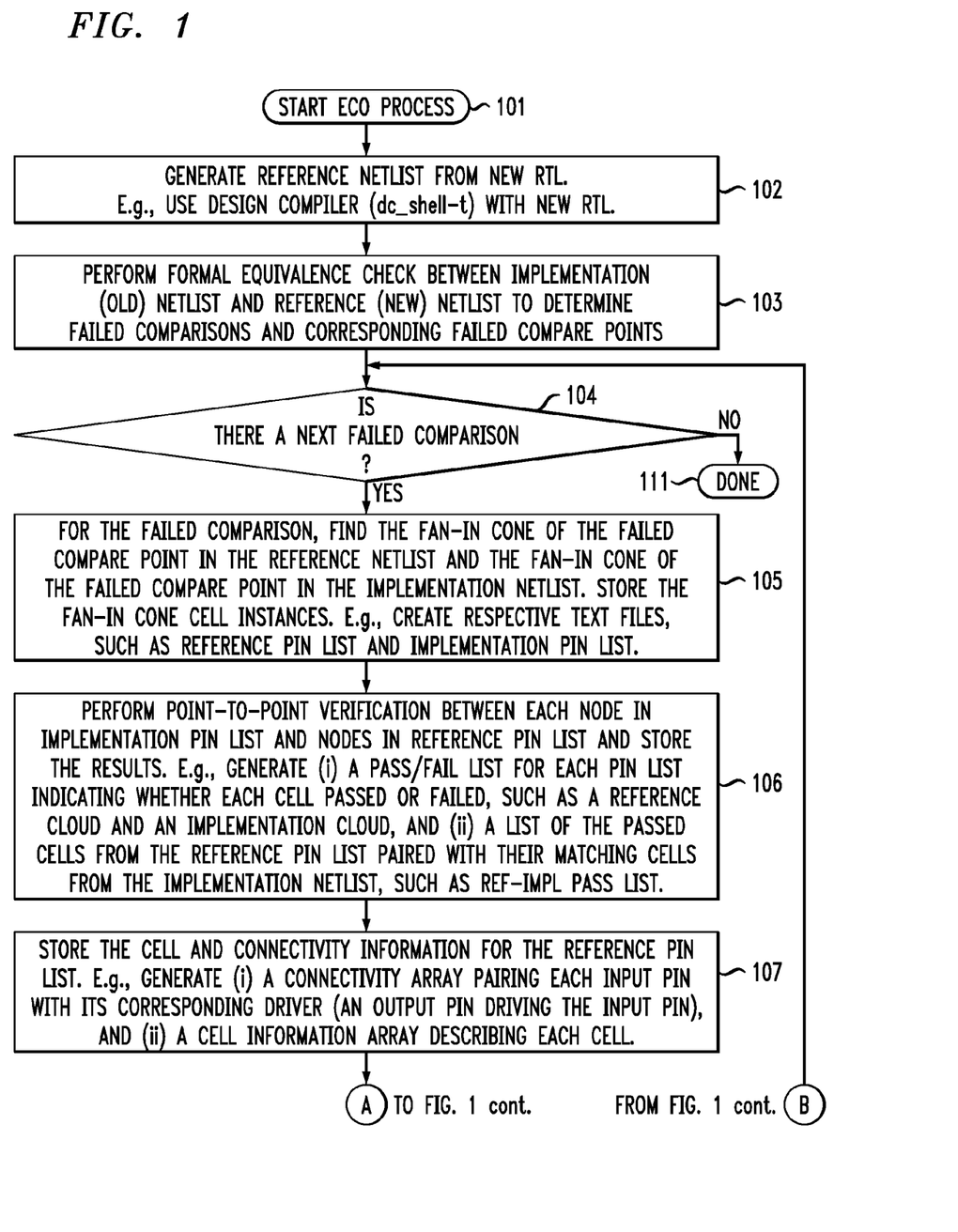
FIG. 1 shows a sample flowchart for one implementation of the present invention.

FIG. 1 shows a sample flowchart for one implementation of this embodiment of the invention. This implementation uses a Design Compiler tool shell interface, dc_shell-t, to access the RTL designs and provide text file outputs, which are used by the Formality tool to provide formal equivalence verification and information. However, any suitable EDA synthesis tool can be used instead of the Design Compiler tool, and/or any suitable EDA equivalence tool can be used instead of the Formality tool. After an ECO automation process is started (step 101), a reference netlist is generated from the new RTL using a synthesis tool (step 102). For example, the Design Compiler tool (dc_shell-t) can process the new RTL to generate the reference netlist. Then a formal equivalence check is performed, using an equivalence tool, on the implementation (old) netlist and the reference (new) netlist to determine failed compare points (step 103). For example, a text file comprising failed compare point information can be generated for the reference and implementation netlists by using the Formality tool's "verify" and "report_failing_points" commands.

Compare points are generally input pins of flip-flops, e.g., D-pins, SD-pins, reset-pins, or clock pins. Compare points may also be the inputs of analog-device black boxes. Compare points in this embodiment are not the input pins of digital logic gates.

If there is a failed comparison (step 104), then the process goes to step 105. In step 105, the fan-in cones are found for the failed compare point in both the reference netlist and the implementation netlist using a synthesis tool. The fan-in cones typically include digital logic gates. The fan-in cone cells' instance information is saved, e.g., in two text files referred to as a reference-pin list and an implementation-pin list, respectively (step 105). Below is sample code, using the Design Compiler tool, for finding the fan-in cones for the compare point in the reference and implementation netlists and generating the respective pin lists:

```
proc fanin_ins_inst {compare_point} {
    set all_cells [all_fanin -to $compare_point -flat -only_cells]
    set all_cells_startpoints [all_fanin -to $compare_point -flat -
        only_cells -startpoints_only]
    set cells [remove_from_collection $all_cells $all_cells_startpoints]
    return $cells
}
```

Next, a point-to-point equivalence verification is performed, using an equivalence tool, between nodes in the reference-pin list and nodes in the implementation-pin list, and the results are stored (step 106). For example, if there are 5 cells in the implementation-pin list and 7 cells in the reference-pin list, then up to 35 point-to-point verifications are performed. Below is sample code, using the Formality too, for comparing the two pin lists:

```
verify-type net $each_impl $each_ref
```

If a matching implementation pin is found for a particular reference pin then the procedure moves on to finding a matching implementation pin for the next reference pin. In an alternative embodiment, if a matching implementation pin is found for the particular reference pin, then the procedure continues to perform verifications so that each implementation pin is compared to the reference pin, and if two or more matching implementation pins are found for the reference pin, then one of the matching implementation pins is selected as the procedure's result to correspond to the reference pin. In an alternative embodiment, the procedure loops through reference pins for each implementation pin.

Reference pins for which a matching implementation pin is found, and the corresponding implementation pins, are categorized as passing, while the other reference and implementation pins are categorized as failing. Storage of the results of the matching step can be in the form of a verification pass/fail list for each pin list indicating whether each pin passed or failed, such as a reference-cloud list and an implementation-cloud list (step 106). Result storage can further include a list, referred to as ref-impl pass list, containing the passed cells from the reference-pin list paired with their matching cells from the implementation netlist (step 106).

The procedure stores the cell and connectivity information for the reference-pin list, e.g., by generating (i) a connectivity array pairing each input pin with its corresponding driver, which is an output pin of a cell, and (ii) a cell information array describing the characteristics of each cell (step 107). Below is sample code, using the Design Compiler tool, for generating the connectivity and cell information arrays:

```
set connectivity($each_input_pin) $driver_pin
proc cell_ref_info {cells} {
    foreach_in_collection each $cells {
        set each_name [get_attribute $each full_name]
        set ref_name [get_attribute $each ref_name]
        set cell_ref1($each_name) $ref_name
    }
    return [array get cell_ref1];
}
```

The procedure then traces, in the reference netlist, the fan-in cone for the failed compare point up to a pass/fail boundary, which marks the border between passed cells and failed cells (step 108). The pass/fail boundary is traced using the reference cloud generated in step 106 and the connectivity array generated in step 107, and is defined in a boundary-pins list (step 108). Also generated is a reference-cells-for-ECO list of the failed cells that are in the fan-in cone of the failed compare point (step 108). The boundary-pins list contains the input pins of the cells in the reference-cells-for-ECO list and indicates, e.g., with a "0" or a "1," whether the driving cell for the pin is within or without, respectively, the reference-cells-for-ECO list, i.e., if the input pin of a cell is connected to a failed cell, then it gets a "0;" while, if the input pin of a cell is connected to a passed cell, then it gets a "1." Below are sample code snippets, using the Design Compiler tool, for setting a pass/fail boundary:

```
set pass_boundary_fail_pass_ipins($each_input_pin)   0
and
set pass_boundary_fail_pass_ipins($each_input_pin)   1
```

In one alternative embodiment, the procedure continues to trace the fan-in cone for the failed compare point past the pass/fail boundary, e.g., (i) the procedure traces the fan-in cone for the failed compare point up to the cells driving the input pins of the cells in the reference-cells-for-ECO list, or (ii) the procedure traces the entire fan-in cone for the failed compare point.

Next, the implementation netlist is modified to incorporate cells corresponding the reference-cells-for-ECO list generated in step 108, thereby generating an ECO netlist (step 109). The failed compare point in the implementation netlist is disconnected from its driving cell (step 109). ECO cells are created in the implementation netlist using the reference-cells-for-ECO list generated in step 108 and the cell information array generated in step 107 (step 109). In one embodiment, all of the ECO cells are created before any are connected. In an alternative embodiment, each ECO cell is created and connected before another ECO cell, if any, is created. The ECO cells are connected using the boundary-pins list generated in step 108, the connectivity array generated in step 107, and the ref-impl pass list generated in step 106, wherein, for each pin of the ECO cells, if the boundary-pin list information for the corresponding reference-pin list pin is "0," then the pin is connected to an ECO pin using the corresponding reference netlist connection as indicated by the reference connectivity array. Otherwise, if the boundary-pin list information for the corresponding reference pin is "1," then the ECO pin is connected using an equivalent implementation netlist connection (step 109).

The equivalent implementation netlist connection is found by finding the driver of the corresponding reference pin in the reference connectivity array, and then finding the driving cell's equivalent cell in the implementation netlist by using the ref-impl pass list generated in step 106 (step 109). Including the failed compare point in the boundary-pins list allows for the automatic connection of the ECO cells to the failed compare point (step 110). If there is a next failed compare point (step 104), then the procedure returns to step 105 to process the failed compare point; otherwise, the procedure terminates at step 111.

The procedure outlined in FIG. 1 allows for making fewer modifications to the implementation netlist than might be required if the entire fan-in cone of the failed compare point were replaced with cells corresponding to the fan-in cone in the reference netlist. It is good practice to verify that the final ECO netlist produced is indeed formally equivalent to the reference netlist by using a formal verification tool.

Figure 2E:
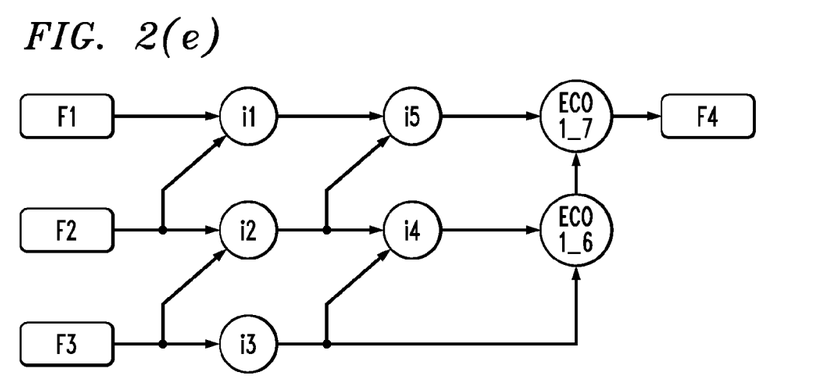
FIGS. 2(r), 2(i), and 2(e) represent a sample representation of the fan-in cones of a failed compare point in exemplary reference, implementation, and ECO netlists, respectively.
Figure 2I:
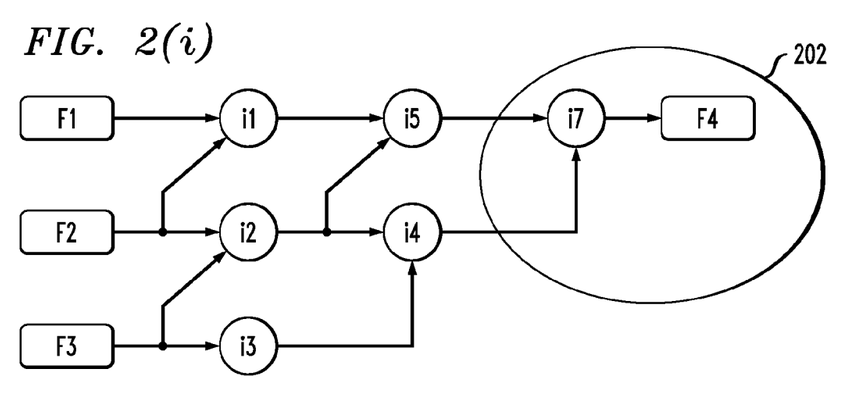
Figure 2R:
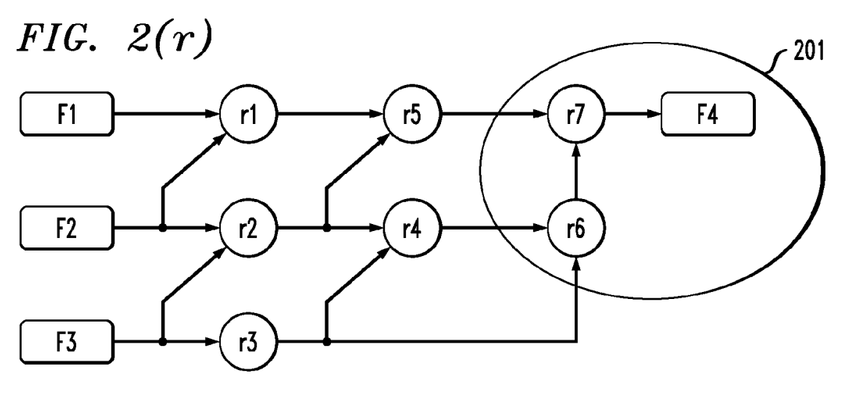

FIGS. 2(r), 2(i), and 2(e) represent a sample representation of the fan-in cones of a failed compare point in exemplary reference, implementation, and ECO netlists, respectively. The round-edged rectangular shapes in the figures, namely F1, F2, F3, and F4, represent flip-flop cells, while the circular shapes in the figures, namely cells r1, r2, r3, r4, r5, r6, and r7 of FIG. 2(r), cells i1, i1, i3, i4, i5, and i7 of FIG. 2(i), and cells i1, i1, i3, i4, i5, ECO1_6 and ECO1_7 of FIG. 2(e) represent digital logic cells. Boundary 201 represents the failure boundary in the reference netlist, while boundary 202 represents the failure boundary in the implementation netlist. FIGS. 2(r), 2(i), and 2(e), in conjunction with FIG. 3, are used to illustrate the operation of an embodiment of the present invention.

Figure 3:
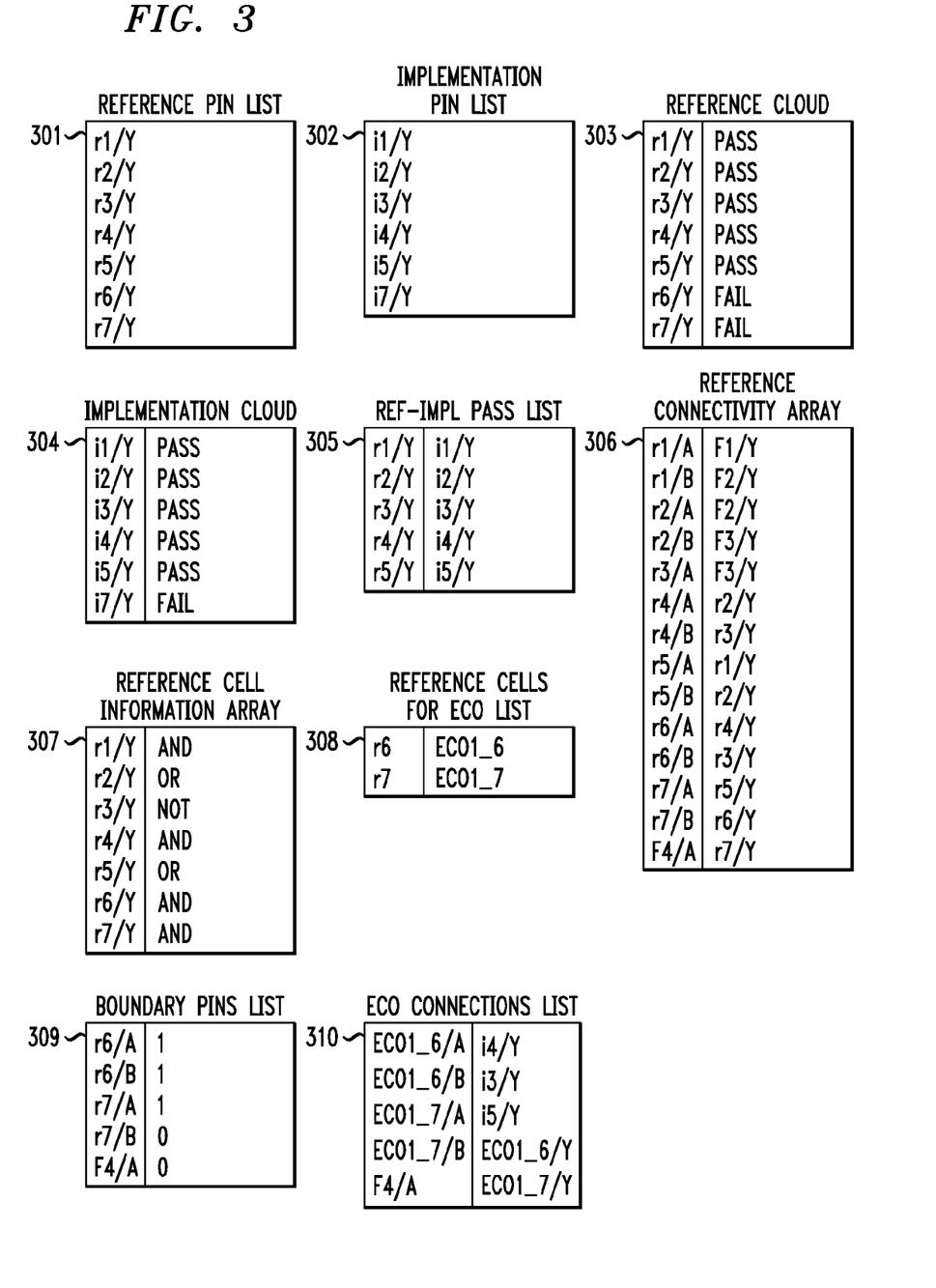
FIG. 3 shows representations of sample tables generated in processing the failed compare point of FIGS. 2(r) and 2(i) in accordance with an embodiment of the present invention.

FIG. 3 shows representations of sample arrays generated in processing the failed compare point of FIGS. 2(r) and 2(i) in accordance with an embodiment of the present invention. The arrays can represent storage in proprietary format, e.g., Design Compiler or TCL format, or storage in a text file. The particular format of the array depends on the particular implementation. In the arrays of FIG. 3, the component suffixes, which follow a forward slash, represent a component pin, wherein "A" and "B" represent input pins and "Y" represents an output pin.

In the following illustrative example, which uses FIGS. 2(r), 2(i), 2(e) and 3, the input to flip-flop cell F4 is a failed compare point, as could be determined, e.g., by performing step 103 of FIG. 1. The fan-in cone for flip-flop cell F4 in the reference netlist is represented by FIG. 2(r), while the fan-in cone for flip-flop cell F4 in the implementation netlist is represented by FIG. 2(i). The fan-in cone for flip-flop cell F4 in the ECO netlist is represented by FIG. 2(e). Reference-pin list 301 of FIG. 3 represents the output pins of the cells of FIG. 2(r) and implementation-pin list 302 represents the output pins of the cells of FIG. 2(i), as could be generated, e.g., by performing step 105 of FIG. 1.

In an alternative embodiment, the pin lists comprise other parts of the appropriate cells. Performing point-to-point equivalence verification, as in step 106 of FIG. 1, results in reference cloud 303, implementation cloud 304, and ref-impl pass list 305. Reference cloud 303 shows that cells r6 and r7 are within the failure boundary, corresponding to boundary 201 in FIG. 2(r). Implementation cloud 304 shows that cell i7 is within the failure boundary, corresponding to boundary 202 in FIG. 2(i). Ref-impl pass list 305 shows which cells in implementation-pin list 302 correspond to the passed cells of reference cloud 303.

Reference connectivity array 306, which shows the driving pins for the cells of reference-pin list 301 and flip-flop cell F4, could be generated by step 107 of FIG. 1, which would also produce reference-cell information array 307, which describes the characteristics of the cells of reference-pin list 301. Using reference cloud 303 and reference connectivity array 306, as in step 108 of FIG. 1, results in reference-cells-for-ECO list 308 and boundary-pins list 309, which describe the failure boundary corresponding to failure boundary 201 of FIG. 2(r). Failure boundary 201 includes the cells in reference-cells-for-ECO list 308 and the borders of failure boundary 201 are defined by pins labeled with "1" in boundary-pins list 309.

The implementation netlist represented by FIG. 2(i) is then modified to implement the ECO, e.g., by performing steps 109 and 110 of FIG. 1, which results in ECO-connections list 310 and an ECO netlist, as represented by FIG. 2(e). The modification to the implementation netlist, based on ref-impl pass list 305, reference-cell information array 307, reference connectivity array 306, reference-cells-for-ECO list 308, and boundary-pins list 309, is as follows: (i) i7/Y is disconnected from F4/A, (ii) new cells ECO1_6 and ECO1_7 are added to the implementation netlist, based on the information in reference-cell information array 307 for the cells in reference-cells-for-ECO list 308, and (iii) the new cells are connected as indicated in ECO-connections list 310.

The example above used a reference netlist and implementation netlist with the same number of input flip-flop cells. However, the embodiment is not limited to such cases. If the reference netlist has fewer input flip-flop cells than the implementation netlist, then no special action needs to be taken as the "extra" input flip-flop cells in the implementation netlist will not be used in the procedure. In fact, those "extra" input flip-flop cells may be removed from the implementation netlist, which should allow for better area utilization. If the reference netlist has more input flip-flop cells than the implementation netlist, then a corresponding number of additional input flip-flop cells should be added to the implementation netlist and their outputs should be connected to one or more appropriately-modified cells within the failure boundary of the implementation netlist. After the above is done, the procedure can be performed as in the sample above for reference and implementation netlists with equivalent numbers of flip-flop cells.

References herein to the verb "to generate" and its variants in reference to information or data do not necessarily require the creation and/or storage of new instances of that information. The generation of information could be accomplished by identifying an accessible location of that information. The generation of information could also be accomplished by having an algorithm for obtaining that information from accessible other information.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

I claim:

1. A method implemented by an integrated-circuit-design computer for generating an engineering change order (ECO) netlist for an integrated circuit (IC), the method comprising:
   (a) performing, by the computer, a formal equivalence check between an implementation netlist and a reference netlist, to identify one or more failed comparisons, at least one failed comparison corresponding to a failed compare point in the implementation netlist and a failed compare point in the reference netlist;
   (b) for the at least one failed comparison:
      (i) identifying, by the computer, a fan-in cone for the corresponding failed compare point in the implementation netlist, wherein the fan-in cone comprises a set of one or more implementation-netlist cells having one or more pins;
      (ii) identifying, by the computer, a fan-in cone for the corresponding failed compare point in the reference netlist, wherein the fan-in cone comprises a set of one or more reference-netlist cells having one or more pins;
      (iii) performing, by the computer, equivalence verifications between the set of one or more implementation-netlist cells and the set of one or more reference-netlist cells to generate pin pass/fail information;
      (iv) tracing, by the computer, the fan-in cone for the corresponding failed compare point in the reference netlist to generate ECO pin and cell information;
      (v) automatically modifying, by the computer, the implementation netlist to generate the ECO netlist by adding one or more new ECO cells to the implementation netlist and appropriately connecting the one or more new ECO cells.

2. The method of claim 1, wherein:
   step (b) further comprises:
      generating cell connectivity information for the set of one or more reference-netlist cells;
      generating cell description information for the set of one or more reference-netlist cells;
   step (b)(iv) comprises tracing the fan-in cone for the corresponding failed compare point in the reference netlist based on the pin pass/fail information and the cell connectivity information; and
   step (b)(v) comprises modifying the implementation netlist based on (1) the pin pass/fail information, (2) the cell connectivity information, (3) the cell description information, and (4) the ECO pin and cell information.

3. The method of claim 2, wherein:
   the set of one or more implementation-netlist cells comprises a reference-pin list;
   the set of one or more reference-netlist cells comprises an implementation-pin list;
   the cell connectivity information comprises a connectivity array; and
   the cell description information comprises a cell information array.

4. The method of claim 2, wherein the cell connectivity information further comprises information regarding a pin of the corresponding failed compare point in the reference netlist.

5. The method of claim 1, wherein:
step (b)(i) comprises representing each of the set of one or more implementation-netlist cells by its output pin; and
step (b)(ii) comprises representing each of the set of one or more reference-netlist cells by its output pin.

6. The method of claim 1, wherein step (b)(iii) comprises generating:
(1) pass/fail results for the set of one or more implementation-netlist cells;
(2) pass/fail results for the set of one or more reference-netlist cells; and
(3) match information correlating each passed cell of the set of one or more implementation-netlist cells to the corresponding passed cell of the set of one or more reference-netlist cells.

7. The method of claim 6, wherein
the pass/fail results for the set of one or more implementation-netlist cells comprises an implementation-cloud list;
the pass/fail results for the set of one or more reference-netlist cells comprises a reference-cloud list; and
the match information comprises a ref-impl pass list.

8. The method of claim 1, wherein step (b)(iv) comprises tracing the fan-in cone for the corresponding failed compare point in the reference netlist substantially up to and substantially no further than a pass/fail boundary.

9. The method of claim 1, wherein step (b)(iv) comprises generating:
(1) new-ECO-cells information; and
(2) boundary pin information comprising information regarding one or more pins of cells corresponding to cells in the new-ECO-cells information.

10. The method of claim 9, wherein step (b)(v) comprises adding the one or more new ECO cells based on the new-ECO-cells information and the cell description information.

11. The method of claim 9, wherein the boundary pin information further comprises information regarding a pin of the corresponding failed compare point in the reference netlist.

12. The method of claim 9, wherein:
the new-ECO-cells information comprises a reference-cells-for-ECO list; and
the boundary pin information comprises a boundary-pins list.

13. The method of claim 1, wherein:
the corresponding failed compare point in the implementation netlist has a driver cell; and
step (b)(v) further comprises disconnecting the corresponding failed compare point in the implementation netlist from the driver cell.

14. The method of claim 1, wherein:
step (b)(iii) further comprises generating match information correlating each passed cell of the set of one or more implementation-netlist cells to the corresponding passed cell of the set of one or more reference-netlist cells;
step (b)(iv) comprises generating:
(1) new-ECO-cells information; and
(2) boundary pin information comprising information regarding each input pin of each reference-netlist cell corresponding to a cell in the new-ECO-cells information; and step b(v) comprises adding one or more new ECO cells based on the new-ECO-cells p information and the cell description information.

15. The method of claim 14, wherein:
the new-ECO-cells information identifies one or more new ECO cells and one or more corresponding cells in the reference netlist, each corresponding cell in the reference netlist having one or more input pins, each input pin having a driver cell in the reference netlist;
step (b)(v) comprises:
for each input pin:
(1) determining, using the boundary pin information, whether the corresponding driver cell is included in the new-ECO-cells information;
(2) if the boundary pin information indicates that the input pin's driver is included in P the new-ECO-cells information, then connecting the corresponding input pin of the corresponding new ECO cell using the connectivity information and the new-ECO-cells information; and
otherwise, finding the driving pin for the input pin from the connectivity information and connecting the corresponding input pin of the corresponding new ECO cell using the match information for the driving pin; and
connecting the corresponding failed compare point in the implementation netlist to an appropriate new ECO cell.

16. The method of claim 14, wherein:
step (b)(iv) further comprises generating ECO connection information; and
step (b)(v) comprises connecting the one or more new ECO cells based on the ECO connection information.

17. The method of claim 16, wherein the ECO connection information is an ECO-connections list.

18. The method of claim 14, wherein:
step (b)(iii) comprises generating pass/fail results for the set of one or more reference-netlist cells;
each input pin of each reference-netlist cell corresponding to a cell in the new-ECO-cells information has a driver cell in the set of one or more reference-netlist cells; and
the boundary pin information indicates the pass/fail result for each driver cell of each reference-netlist cell corresponding to a cell in the new-ECO-cells information.

19. The method of claim 1, wherein:
the implementation netlist is generated from a first register transfer level (RTL) design for the IC; and
the reference netlist is generated from a second RTL design for the IC.

20. A system for generating an engineering change order (ECO) netlist for an integrated circuit (IC), the system comprising:
(a) means for performing a formal equivalence check between an implementation netlist and a reference netlist, to identify one or more failed comparisons, at least one failed comparison corresponding to a failed compare point in the implementation netlist and a failed compare point in the reference netlist;
(b) for the at least one failed comparison:
(i) means for identifying a fan-in cone for the corresponding failed compare point in the implementation netlist, wherein the fan-in cone comprises a set of one or more implementation-netlist cells having one or more pins;
(ii) means for identifying a fan-in cone for the corresponding failed compare point in the reference netlist, wherein the fan-in cone comprises a set of one or more reference-netlist cells having one or more pins;

(iii) means for performing equivalence verifications between the set of one or more implementation-netlist cells and the set of one or more reference-netlist cells to generate pin pass/fail information;

(iv) means for tracing the fan-in cone for the corresponding failed compare point in the reference netlist to generate ECO pin and cell information;

(v) means for automatically modifying the implementation netlist to generate the ECO netlist by adding one or more new ECO cells to the implementation netlist and appropriately connecting the one or more new ECO cells.

* * * * *